United States Patent
Ohtaki et al.

(10) Patent No.: US 8,454,860 B2
(45) Date of Patent: Jun. 4, 2013

(54) ALUMINUM-CONTAINING ZINC OXIDE-BASED N-TYPE THERMOELECTRIC CONVERSION MATERIAL

(75) Inventors: Michitaka Ohtaki, Fukuoka (JP); Kazuhiko Araki, Kanagawa (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 418 days.

(21) Appl. No.: 12/992,175

(22) PCT Filed: Feb. 17, 2009

(86) PCT No.: PCT/JP2009/052684
§ 371 (c)(1), (2), (4) Date: Nov. 11, 2010

(87) PCT Pub. No.: WO2009/154019
PCT Pub. Date: Dec. 23, 2009

(65) Prior Publication Data
US 2011/0101286 A1  May 5, 2011

(30) Foreign Application Priority Data
Jun. 19, 2008  (JP) .................... 2008-160994

(51) Int. Cl.
| | |
|---|---|
| H01B 1/02 | (2006.01) |
| H01L 29/12 | (2006.01) |
| C04B 35/00 | (2006.01) |
| C01F 7/00 | (2006.01) |
| C01F 3/00 | (2006.01) |
| C01G 15/00 | (2006.01) |
| C01G 9/02 | (2006.01) |
| C01G 11/02 | (2006.01) |
| C01G 13/02 | (2006.01) |

(52) U.S. Cl.
USPC .............. 252/519.51; 252/62.3 T; 252/519.5; 423/594.14; 423/600; 423/624

(58) Field of Classification Search
USPC ........ 252/62.3 T, 519.5, 519.51; 423/594.14, 423/600, 624
See application file for complete search history.

(56) References Cited

U.S. PATENT DOCUMENTS
2007/0144573 A1  6/2007  Mihara et al.

FOREIGN PATENT DOCUMENTS
| | | | |
|---|---|---|---|
| JP | 62-132380 A | | 6/1987 |
| JP | 1-262678 A | | 10/1989 |
| JP | 8-186293 A | | 7/1996 |
| JP | 2001-044520 A | | 2/2001 |
| JP | 2001-284661 A | | 10/2001 |
| JP | 2002-016297 A | | 1/2002 |
| JP | 2004-146586 A | | 5/2004 |
| JP | 2007-059491 A | | 3/2007 |
| JP | 2007-246294 A | | 9/2007 |
| KR | 20040106282 | * | 12/2004 |
| WO | 2005/091393 A1 | | 9/2005 |
| WO | 2005/093864 A1 | | 10/2005 |
| WO | 2007/108147 A1 | | 9/2007 |
| WO | WO 2008073469 A1 | * | 6/2008 |

OTHER PUBLICATIONS

Ohtaki, Michitaka et al "High-temperature thermoelectric properties of (Zn1—xAlx)O," J. Appl Phys., Feb. 1996, vol. 79, No. 3, pp. 1816-1818.
Ohtaki, Michitaka and Hayashi, Ryosuke "Enhanced Performance of Nanostructured ZnO: A possibility of selective phonon scattering and carrier energy filtering by nanovoid structure," ICT '06. 25th International Conference on Thermoelectrics, Aug. 6 2006, pp. 276-279.
International Search Report of PCT/JP2009/052684, Mar. 17, 2009.

* cited by examiner

*Primary Examiner* — Harold Pyon
*Assistant Examiner* — Tanisha Diggs
(74) *Attorney, Agent, or Firm* — Westerman, Hattori, Daniels & Adrian, LLP (57) ABSTRACT

ZnAlO series thermoelectric conversion materials have large thermal conductivity κ about 40 W/mK at room temperature, thus the dimensionless figure of merit ZT remains around 0.3 at 1000 deg C, which is a third of the value required in practical application. An n-type thermoelectric conversion material, comprising aluminum including zinc oxide, which is represented by a general formula: $Zn_{1-x-y}Al_xGa_yO$ (wherein $0.01 \leq x \leq 0.04$, $0.01 \leq y \leq 0.03$, $0.9 \leq x/y \leq 2.0$). ZT value not less than 0.6 can be realized at 1000 deg C. By co-doping Al and Ga into ZnO, the thermal conductivity κ can be significantly reduced maintaining a large electric conductivity σ, resulting in a significant improvement of the thermoelectric performance.

3 Claims, 8 Drawing Sheets

$Zn_{0.96}Al_{0.02}Ga_{0.02}O$ Sample $Zn_{0.97}Al_{0.02}Ga_{0.01}O$ Sample

ALUMINUM-CONTAINING ZINC OXIDE-BASED N-TYPE THERMOELECTRIC CONVERSION MATERIAL

FIELD

Present invention relates to Zinc Oxide-based thermoelectric conversion material, particularly, to Aluminum-containing Zinc Oxide-based n-type thermoelectric conversion material.

BACKGROUND

An Aluminum doped Zinc-Oxide (hereafter, "ZnAlO") which is represented by a formula $Zn_{1-x}Al_xO$ ($0.01 \leq x \leq 0.05$) where a part of zinc is replaced by aluminum, is known as n-type thermoelectric conversion material (patent references 1, 2, non-patent reference 1.)

ZnAlO exhibits a large electric conductivity (about 1000 S/cm) and a large Seebeck coefficient (100 to 200 µV/deg C in absolute value; Seebeck coefficient in a n-typed material is expressed by a minus value) in a wide temperature range (0 to 1000 deg C.), thus a power factor obtainable also is 5 to 10 times larger than those of iron-silicide series thermoelectric conversion materials.

ZnAlO does not include expensive rare earth elements and therefore has such features as low cost manufacturing, low toxicity against human body, and the power factor which is larger than other n-type thermoelectric conversion materials. On the other hand, thermal conductivity is extremely larger than those of other n-type thermoelectric materials. Because of that reason, there is a problem that a figure of merit Z cannot be enhanced large enough, in spite of the large power factor.

ZnAlO is obtained by sintering the power material at 1200 to 1400 degree C. Much efforts have been devoted in order to reduce the large thermal conductivity by improving manufacturing methods including: obtaining a sintered body of ZnAlO having crystal particle size of not greater than 40 µm from material of average particle size of around 300 µm (Patent reference 3), causing solid solution of lanthanum or nickel into ZnAlO (patent reference 4), causing crystalline orientation by mixing a material which generates an electrically conductive thermoelectric oxides having crystal anisotropy with ZnAlO (patent reference 5), replacing a part of Zn sites of ZnAlO by Fe (patent reference 6), manufacturing ZnAlO by the discharge plasma sintering (patent reference 7) and so on. The inventors of the present application reported that ZT=0.65 was obtained by introducing nanosized pores into a dense ZnAlO sintered body (patent reference 8, non patent reference 2).

By the way, oxide thermoelectric conversion materials are manufactured by the sintering method in general, ZnO series film materials may be manufactured by using film deposition methods such as sputtering method, vacuum deposition method, CVD method, laser ablation method (patent reference 9).

Patent reference 1: Japanese laid-open patent publication No. 62-132380,
Patent reference 2: Japanese laid-open patent publication No. 08-186293,
Patent reference 3: Japanese laid-open patent publication No. 2001-044520,
Patent reference 4: Japanese laid-open patent publication No. 2001-284661,
Patent reference 5: Japanese laid-open patent publication No. 2002-016297,
Patent reference 6: Japanese laid-open patent publication No. 2007-059491,
Patent reference 7: Japanese laid-open patent publication No. 2007-246294,
Patent reference 8: International Publication Pamphlet No. WO2005/091393A1,
Patent reference 9: Japanese laid-open patent Publication No. 2004-146586,
Non-Patent reference 1: M. Ohtaki et al., J. Appl. Phys., 79, 11816 (1996)
Non-Patent reference 2: M. Ohtaki et al., Proc. 25$^{th}$ Int. Conf. Thermoelectrics, pp. 276-279 (2006)

DISCLOSURE OF THE INVENTION

Problems to be Solved by the Invention

Conventionally p-type and n-type thermoelectric conversion materials are known. The thermoelectric conversion material is a functional material which can produce electric power based on electromotive force generated by the temperature difference caused in the material. The performance of the thermoelectric conversion material is represented by a figure of merit Z. More precisely, the figure of merit Z is given by below equation (1).

$$Z=S^2 \times \sigma / \kappa \qquad (1)$$

Here, S denotes Seebeck coefficient ($VK^{-1}$), σ, electric conductivity ($Scm^{-1}$), and κ, thermal conductivity ($Wm^{-1}K^{-1}$).

Here, the term ($S^2 \times \sigma$) in the equation is called by a specific name as "power factor." In order to enhance the thermoelectric performance (to increase Z) of thermoelectric conversion materials, it is important to increase the power factor and reduce the thermal conductivity κ, taking into account the equation (1). Also, a higher dimensionless figure of merit ZT (T is an absolute temperature in K) which indicates the performance at the operating temperature gives a better thermoelectric performance.

The oxide thermoelectric conversion materials are expected as thermoelectric conversion materials having an excellent environmental acceptability which are applicable at high temperature up to 600 to 1000 deg C., because of their superiority in heat tolerance, mechanical strength, and also because of safety and low cost availability, in general. However, in present stage, their thermoelectric conversion performance is far inferior to those of conventional materials.

The ZnAlO series thermoelectric conversion materials exhibit the largest dimensionless figure of merit ZT at around β=0.02, where the mole content ratio of Zn and Al is taken as α:β (wherein, α+β=1). However, because of large thermal conductivity κ as large as about 40 W/mK at the room temperature, ZT value remains around 0.3 at 1000 deg C., which is a third of practical level. On the other hand, for the bulk n-type oxide thermoelectric conversion materials, the highest performance index so far has been ZT=0.37 at 1000K in SrTiO$_3$ series. ZT=0.45 at 1000 deg C. in (In, Ge)$_2$O$_3$ series has just orally been reported in a recent international conference.

Means to Solve the Problems

The inventors of the present application discovered that a significant reduction of thermal conductivity κ can be realized maintaining a large electric conductivity σ, by co-doping of aluminum and gallium into zinc oxide, and that the thermoelectric performance is significantly enhanced.

In other words, the present invention is n-type thermoelectric conversion materials comprising aluminum containing zinc oxide represented by the general composition formula: $Zn_{1-x-y}Al_xGa_yO$, (wherein, $0.01 \leq x \leq 0.04$, $0.01 \leq y \leq 0.03$, $0.9 \leq x/y \leq 2.0$).

The present invention enables to provide an n-type thermoelectric conversion material having the dimensionless figure of merit (ZT) not less than 0.2 at 600 deg C.

The thermoelectric conversion material of the present invention is obtained preferably by a method of sintering material powders, or by manufacturing a sintered body, where Al and Ga are co-doped into ZnO as solid solution, and where also the fine particles originated from Ga are dispersed.

The reason why the dimensionless figure of merit (ZT) of the present invention is significantly large is inferred as: the amount of solid solution of Al which replace Zn sites increases by the co-doping of aluminum and gallium, and at the same time fine structures are formed where fine particles having the diameter of 100 nm to 500 nm which are presumed to be complex oxides of Al and Ga are dispersed in matrix, causing strained fields due to randomness of crystal lattices of matrix and increase in crystal grain boundaries, resulting in significant reduction in thermal conductivity.

Effect of the Invention

An improvement of thermoelectric performance, a twice larger ZT value than those of conventional ZnAlO series thermoelectric conversion materials has been attained. This is at the same time, a world record as a thermoelectric performance for the bulk n-type oxide thermoelectric conversion materials.

THE BEST MODE OF EMBODIMENTS

The ZnAlO series thermoelectric conversion materials and manufacturing methods for the present invention are explained below. The ZnAlO series thermoelectric conversion materials of the present invention are represented by the general composition formula: $Zn_{1-x-y}Al_xGa_yO$, (wherein, $0.01 \leq x \leq 0.04$, $0.01 \leq y \leq 0.03$, $0.9 \leq x/y \leq 2.0$). Aluminums usually form a substitutional solid solution where a part of zinc atoms of zinc oxides are substituted, or an interstitial solid solution where aluminums have intruded between the crystal lattices.

In order to form a solid solution, x indicating aluminum containing amount should preferably be $0.01 \leq x \leq 0.04$, and more preferably, should be $0.015 \leq x \leq 0.025$. When x is smaller than 0.01, the electric conductivity is small and a large dimensionless figure of merit (ZT) cannot be attained. When only aluminum is added in zinc oxides (y=0), when x is more than 0.0 an insulator $ZnAl_2O_4$ are generated in large quantity and gives a small ZT value.

Gallium belongs to the elements of the $13^{th}$ family as aluminum does and forms a substitutional solid solution or an interstitial solid solution when doped to zinc oxide. When aluminum and gallium are co-doped to zinc oxide, the solid solubility limit of aluminum against zinc oxide is expanded, the generation of $ZnAl_2O_4$ due to high aluminum doping is suppressed. Thus, Al doping at a concentration higher than that in case of aluminum only doping become feasible.

It is preferable that the y value representing Ga content is within $0.01 \leq y \leq 0.03$, or more preferably within $0.015 \leq y \leq 0.025$. The doping effect of Ga is small when y is smaller than 0.01, while a y value larger than 0.03 causes deterioration of sintering performance and results in a small electric conductivity. The mole ratio of aluminum content against gallium content is selected as $0.9 \leq x/y \leq 2.0$. When x/y is smaller than 0.9, the effect of increasing electric conductivity by Al doping is insufficient, while when it is larger than 2.0, the generation of $ZnAl_2O_4$ cannot be suppressed and thus not favorable. More preferably, the ratio should satisfy $1 \leq x/y \leq 1.5$.

The thermoelectric conversion materials of the present invention can be manufactured using low cost materials and conventional sintering method. As for Zn source, ZnO powder material having an average diameter of 2 μm or less, preferably of 100 to 500 nm, as for Al source, alumina powder having an average diameter of 1 μm or less, preferably of 20 nm to 0.5 μm, and as for Ga source, $Ga_2O_3$ powder having an average diameter of 20 nm to 2 μm may be used. Various types of alumina may be used, but γ alumina is particularly preferable since solid solution of γ type alumina to zinc oxide is easily caused. On the other hand, a mixture of Al doped to ZnO powder material and Ga doped ZnO powder material, or powder where Al and Ga are co-doped into ZnO powder material may also be used.

The sintering temperature is preferably be 1000 to 1420 deg C., more preferably 1300 to 1400 deg C. A temperature that is lower than 1000 deg C. causes a small electric conductivity due to insufficiently large density of sintered body, which is not preferable. A temperature over 1420 deg C. causes start of sublimation of zinc oxide, which is not preferable. It is preferable to press mold the powder material before the sintering to pressed powder density of 3.5 to 4.5 g/cm³ and then sinter. Also after slurry including the powder materials has been solidified to form a compact, the compact may be sintered. The sintering may be done in the air or in vacuum or in an inert gas. The sintering time would be an hour or more, preferably be 3 to 7 hours. Conventional sintering at atmospheric pressure brings the sintered body of relative density 93 to 98%, while other methods such as a hot press sintering, a hot isostatic press sintering, a spark plasma sintering, an electric current sintering may be used.

By the way, the relative density in the present specification is calculated by following equation. That is, defining a measured density for bulk body including voids and defects as gross density (actual density), and a theoretically calculated density without having voids and defects as theoretical density, the relative density is calculated by substituting the both densities into [(gross density)/(theoretical density)×100(%).]

The average diameter of crystal particles of the thermoelectric conversion materials of the present invention is not determinative, but preferably is 2 μm or less, more preferably 500 nm or less and 100 nm or more. By the way, this value is determined by the arithmetic average of measured diameter values obtained by intercept method or image analysis method for more than 100 crystal particles arbitrary selected in electron microscope observation.

The thermal conductivity κ of the thermoelectric conversion material of the present invention decreases with a decrease in the relative density. This is an effect basically related to the fact that the lowering of the relative density is caused by more porous body. Such a relation substantially agrees with relative curves specified theoretically by Maxwell equations. When the relative density is fixed, the thermal conductivity κ decreases with an increase in the measuring temperature of the sintered body. Thus, a higher operating temperature of the material enables a use with a smaller thermal conductivity.

So far, the manufacturing method of a bulk sintered body using a compact of powder material was explained. However, the thermoelectric conversion material of the present invention may be manufactured as thin film material using the film deposition method disclosed in the patent reference 9, for example. The thick film materials may also be manufactured using flame spraying method, doctor blade method, slurry coating method and so on utilizing mixture, compact, or sintered body of ZnO powder, $Al_2O_3$ powder, $Ga_2O_3$ powder.

Embodiment 1

ZnO (99.5% purity) powder from Kishida Chemical Co., Ltd., $γ-Al_2O_3$ powder obtained by hydrolysis and sintering of aluminum isopropoxide from Kishida Chemical Co., Ltd. and $Ga_2O_3$ (99.99% purity) powder from Kishida Chemical CO., Ltd. were weighed each to constitute $Zn_{0.98-y}Al_{002}Ga_y$ (y=0.01, 0.02, 0.03, 0.04, 0.05), then crushed and mixed by a ball mill for 24 hours, thus mixed powders A (y=0.01), B (y=0.02), C (y=0.03), D (y=0.04) and E (y=0.05) were prepared. Each of those mixed powders A to E was pounded in a mortar, and shaped under uniaxial pressure at 51 kgf/cm$_2$, further shaped under isotropic hydrostatic pressured at 1130 kgf/cm$_2$ and then sintered for 5 hours at 1400 deg C. under nitrogen gas ambient. Here, $Zn_{0.98}Al_{0.02}O$ sintered body was used as a reference sample.

Figure 1:
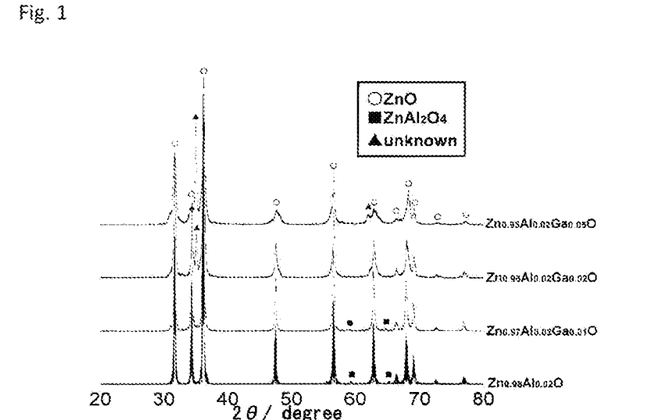
FIG. 1 is a graph indicating X-Ray Diffraction (XRD) curves for the sintered body obtained in the embodiment 1.

In FIG. 1, XRD curves for the reference sample and $Zn_{0.98-y}Al_{0.02}Ga_yO$ are shown. Peaks attributed to $ZnAl_2O_4$ which were observed in the sintered body of ZnAlO and the sintered body of mixed powder A (y=0.01) cannot be observed for the sintered body B (y=0.02) and E (y=0.05), but an unknown peak near 35 degree was observed corresponding the doping amount. This fact suggests the expansion of the solid solubility limit due to the co-doping of Ga and Al.

Figure 2:
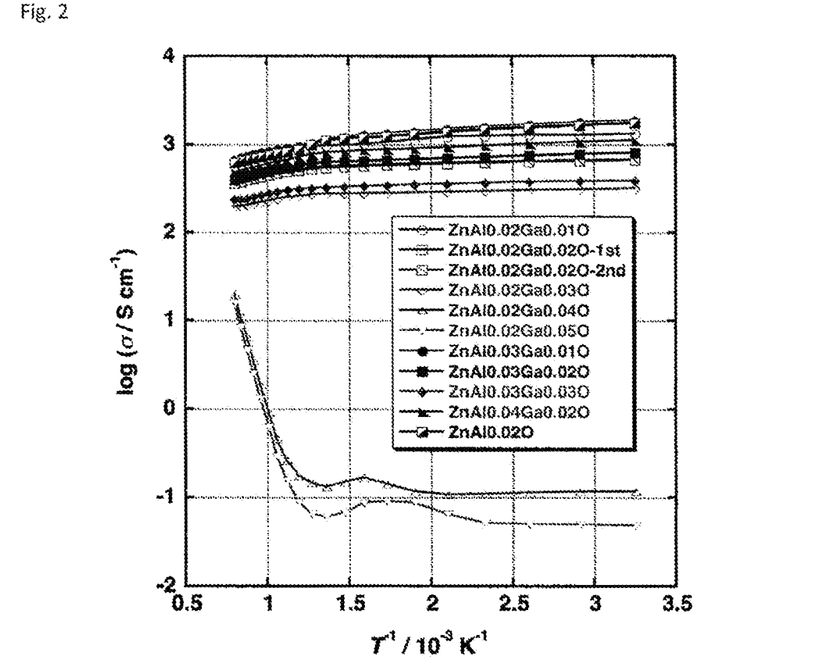
FIG. 2 is a graph indicating the thermoelectric property (temperature dependence of electric conductivity) for the sintered bodies obtained in the embodiments 1 and 2.
Figure 3:
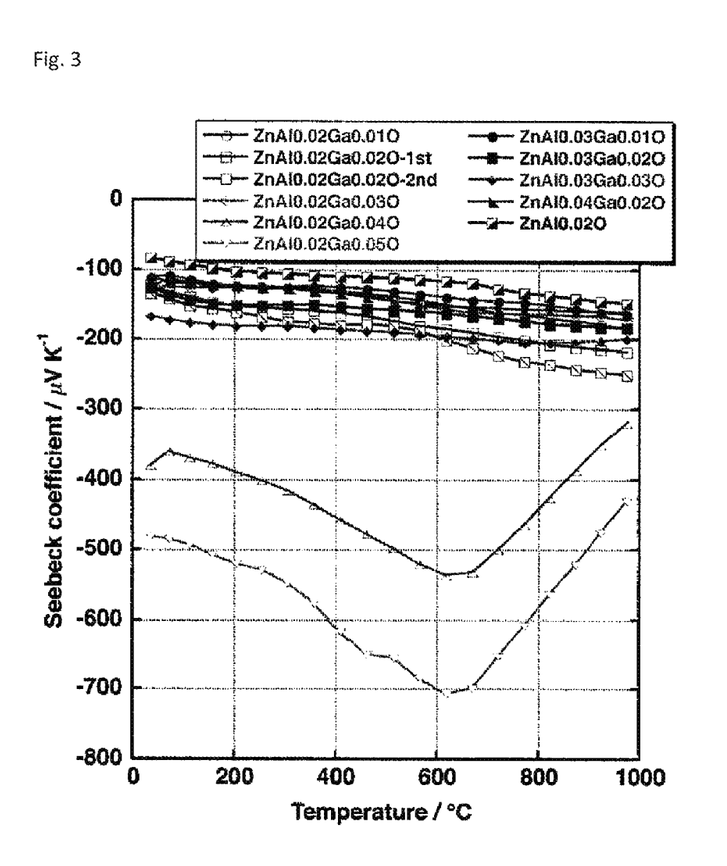
FIG. 3 is a graph indicating the thermoelectric property (temperature dependence of Seebeck coefficient) for the sintered bodies obtained in the embodiments 1 and 2.
Figure 4:
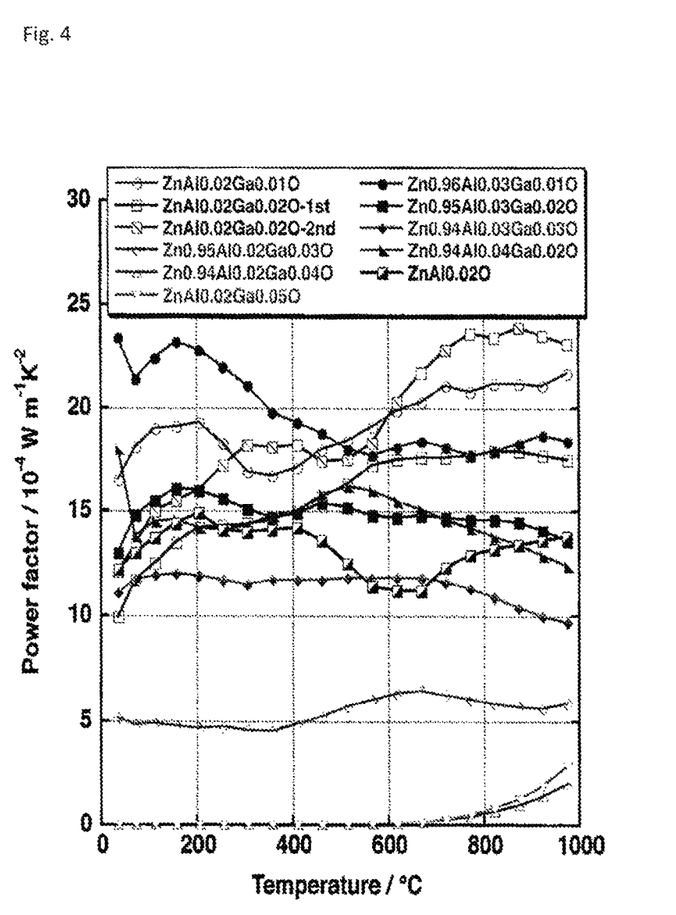
FIG. 4 is a graph indicating the thermoelectric property (temperature dependence of power factor) for the sintered bodies obtained in the embodiments 1 and 2.

FIGS. 2 to 6 indicate the thermoelectric properties for each sintered body obtained. As seen in FIG. 2, the electric conductivity of the sintered bodies for the mixed powders A to C indicated metal like behaviors as well as the reference sample. Whilst, the sintered bodies for the mixed powders D and E, exhibited the electric conductivity five magnitudes smaller than those at room temperature and indicated semiconductor like behavior where the electric conductivity increases with increasing temperature. The electric conductivities for the sintered bodies of mixed powders A to C were all a little smaller than that of the reference sample. However as indicated in FIG. 3, the absolute values for the Seebeck coefficient became significantly larger than that of reference sample, thus the power factor became significantly larger than that of the reference sample as shown in FIG. 4.

Figure 5:
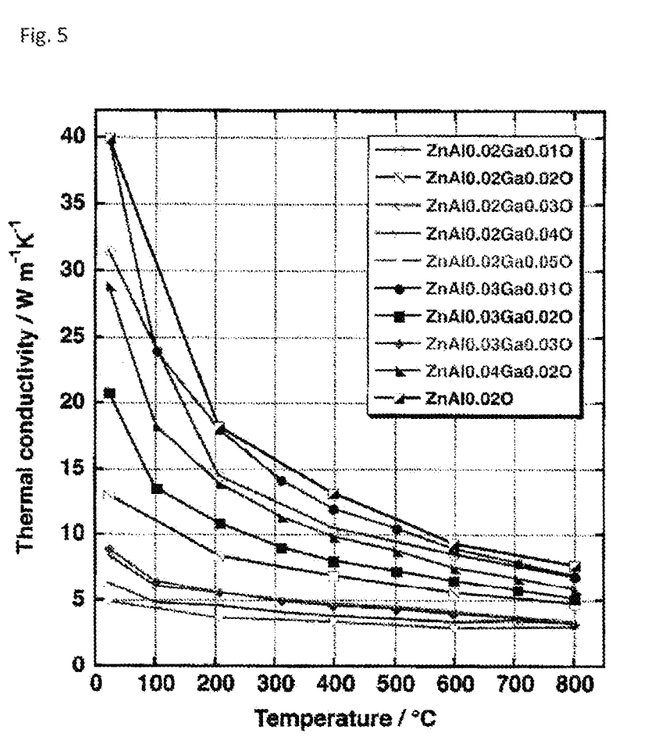
FIG. 5 is a graph indicating the thermoelectric property (temperature dependence of thermal conductivity) for the sintered bodies obtained in the embodiments 1 and 2.
Figure 6:
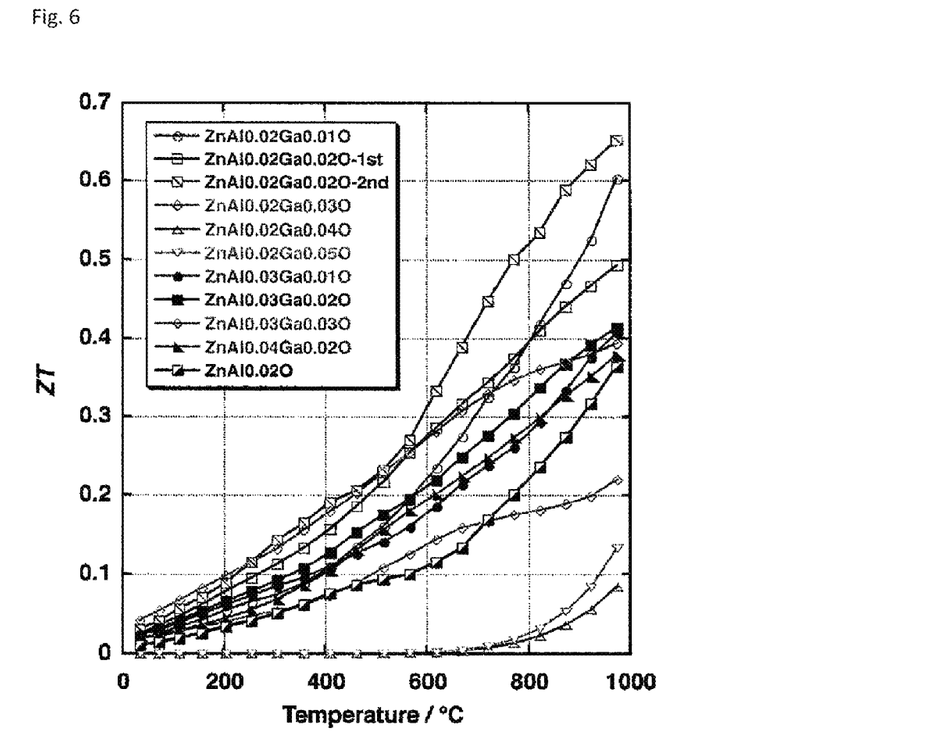
FIG. 6 is a graph indicating the thermoelectric property (temperature dependence of dimensionless figure of merit) for the sintered bodies obtained in the embodiments 1 and 2.

As shown in FIG. 5, the reduction rate of thermal conductivity for ZnAlO due to co-doping is not so large at high temperature around 600 to 1000 deg C. compared to the reduction rate at room temperature. However, meaningful reductions are observed for all temperature range from room temperature to around 1000 deg C. The dimensionless figure of merit ZT in FIG. 6 became significantly larger compared to that of the reference sample, resulting in twice larger thermoelectric performance than that of conventional method; ZT=0.61 (at 1000 deg C.) for $Zn_{0.97}Al_{0.02}Ga_{0.01}O$, ZT=0.65 (at 1000 deg C.) for $Zn_{0.96}Al_{0.02}Ga_{0.02}O$. In FIG. 6, some samples exhibited values less than 0.2 at 600 deg C. However, even for such compositions, the values not less than 0.2 can be obtained by shaping selection of sintering method, sintering conditions and so on. Table 1 summarizes gross density, thermal conductivity and thermal diffusion coefficient for the obtained sintered bodies.

TABLE 1

Gross density, thermal conductivity and thermal diffusion coefficient for the samples

| Name of sample | Gross density [g/cm$^3$] | λ [W/mK] | α [×10$^{-5}$m$^2$/s] |
|---|---|---|---|
| $Zn_{0.98}Al_{0.02}O$ | 5.385 | 39.97 | 12.56 |
| $Zn_{0.97}Al_{0.02}Ga_{0.01}O$ | 5.575 | 31.52 | 11.42 |
| $Zn_{0.96}Al_{0.02}Ga_{0.02}O$ | 5.563 | 13.01 | 4.50 |
| $Zn_{0.93}Al_{0.02}Ga_{0.05}O$ | 4.964 | 4.88 | 1.91 |

Figure 7:
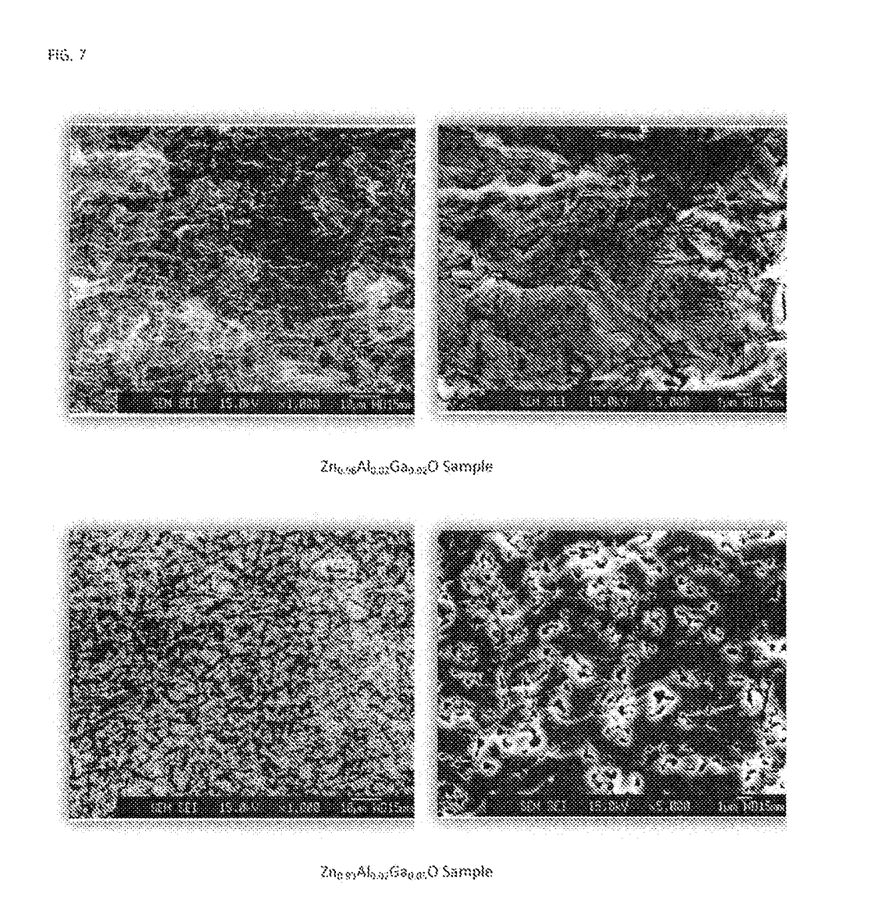
FIG. 7 is a SEM photograph of a cross section for the sintered body obtained in the embodiment 1, instead of a drawing.

FIG. 7 shows SEM photographs for the cross sections of the sintered bodies of the mixed powders B and E. The photographs shown in the upper half of the FIG. 7 for the sintered body of the mixed powder B has a dense matrix, on the other hand, the sintered body for the mixed powder E, shown in the lower half, exhibits rough and large voids, indicating very poor sintering performance. Also in the sintered body of the mixed powder B, a structure with dark colored fine particles having diameters of 50 to 150 nm dispersed in a dense matrix of ZnO is observed in whole area. This structure is deemed to be a phase originated from Ga, since the amount of this fine particles corresponds to Ga doping amount, and to be one of the causes that the significant reduction of thermal conductivity occurs maintaining a large electric conductivity.

Embodiment 2

With the same sequence as in the embodiment 1, oxide powder materials were weighed each to constitute $Zn_{1-x-y}Al_x$-$Ga_y$ (x=0.03, 0.04; y=0.01, 0.02, 0.03), then crushed and mixed by a ball mill for 24 hours. Thus mixed powders F (x=0.03, y=0.01), G (x=0.03, y=0.02), H (x=0.03, y=0.03), and I (x=0.04, y=0.02) were prepared. Those mixed powders were sintered in the same condition as that of the embodiment 1.

FIGS. 2 to 6 indicate the thermoelectric properties for each sintered body obtained together with the results on the embodiment 1. As seen in FIG. 2, the electric conductivity of the sintered bodies for the mixed powders F to I all indicated metal like behaviors as well as the reference sample does. When compared on samples having a same Ga amount, the mixed powders F to I having Al content x=0.03 exhibited electric conductivities larger than those of the mixed powders A to C having Al content x=1.02. From those results we know that the solid solubility limit for Al is expanded by co-doping of Ga, and that the high concentration Al-doping created carriers effectively.

Accompanied with this, the sintered bodies of the mixed powders F to I exhibited a little smaller values for the absolute values of the Seebeck coefficient indicated in FIG. 3. The power factor shown in FIG. 4 became larger than that of the reference sample in almost all the temperature range, except for the sintered body of the mixed powder H (x=0.03, y=0.03).

As shown in FIG. 5, the thermal conductivity reduces with an increase in Ga content y. Thus, the dimensionless figure of merit ZT became larger for all samples excluding the sintered bodies of the mixed powders D and E, compared with that of the reference sample, as in FIG. 6. Particularly in the medium temperature range or 600 to 700 deg C., the improvement of the thermoelectric performance was about twice for the samples with Ga content y=0.03, about triple for the samples with Ga content y=0.02.

[Reference Samples]

Instead of $Ga_2O_3$ powder in the embodiment 1, $In_2O_3$, an oxide of indium which is an element of the same 13th family, was used and weighed each to constitute $Zn_{0.97}Al_{0.02}In_{0.01}O$.

Thus, the sintered body of $Zn_{0.97}Al_{0.02}In_{0.01}$ was manufactured with the other conditions same as those in the embodiment 1.

Figure 8:
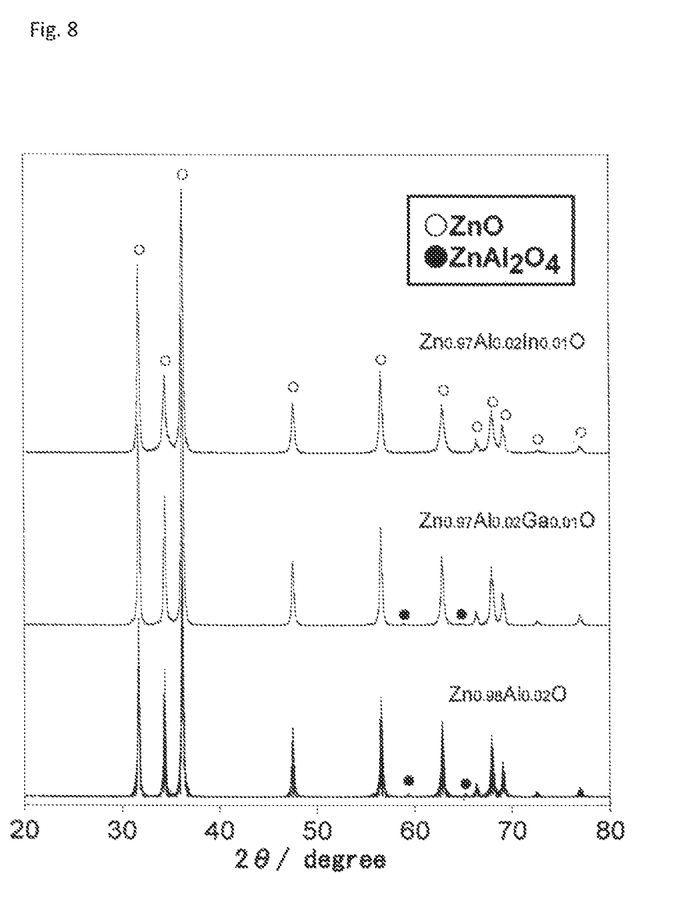
FIG. 8 is a graph indicating XRD curves for the sintered body obtained in the reference sample 1.

In FIG. 8, XRD curves are shown together for the obtained sintered bodies; for the reference sample and for $Zn_{0.97}Al_{0.02}Ga_{0.01}$ sintered body. The reference sample exhibits peaks attributed to a small amount of $ZnAl_2O_4$. However, the peak attributed to $ZnAl_2O_4$ peak is not observed in the sintered body of $Zn_{0.97}Al_{0.02}In_{0.01}$. This fact suggests a possibility that the solid solubility limit of Al is enlarged in the sintered body, ZnAlInO.

Table 2 compares gross density, thermal conductivity and thermal diffusion coefficient for the sintered body ZnAlInO obtained, with those for the reference sample and for the sintered body $Zn_{0.98}Al_{0.02}Ga_{0.01}O$. For the sintered body in which In was co-doped in ZnAlO, thermal conductivity and thermal diffusion coefficient significantly decreased in spite of an increase in the gross density.

TABLE 2

Gross density, thermal conductivity and thermal diffusion coefficient for the samples

| Name of sample | Gross density [g/cm$^3$] | λ [W/mK] | α [×10$^{-5}$m$^2$/s] |
|---|---|---|---|
| $Zn_{0.98}Al_{0.02}O$ | 5.385 | 39.97 | 12.56 |
| $Zn_{0.97}Al_{0.02}Ga_{0.01}O$ | 5.575 | 31.52 | 11.42 |
| $Zn_{0.97}Al_{0.02}In_{0.01}O$ | 5.577 | 19.83 | 6.23 |

Figure 9:
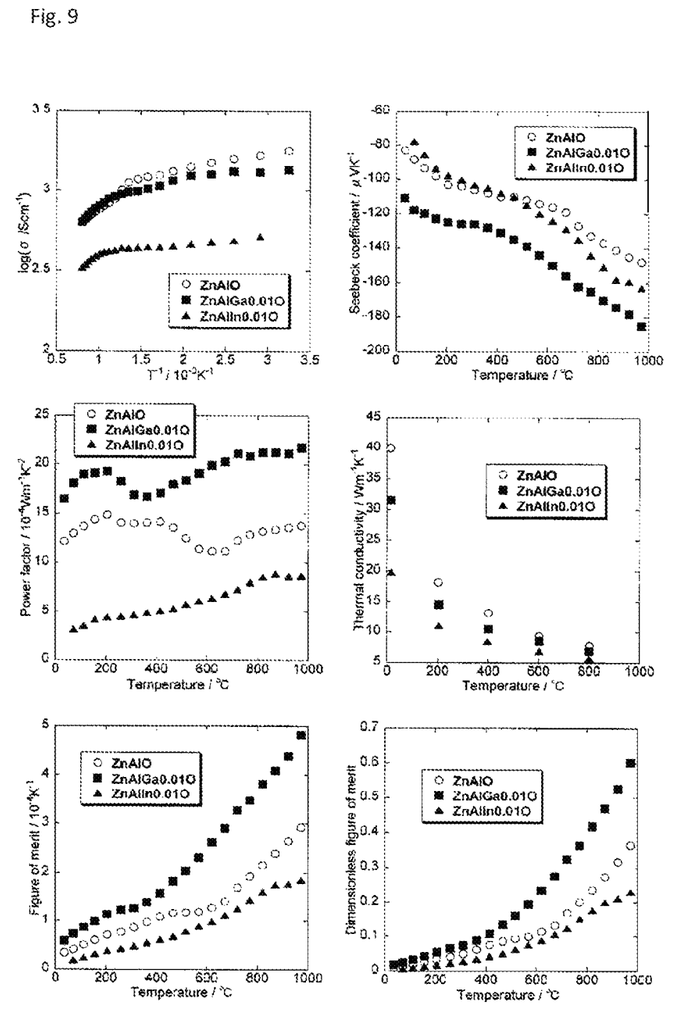
FIG. 9 is a graph indicating the thermoelectric property for the sintered body obtained in the reference sample 1.

FIG. 9 compares the thermoelectric properties for the sintered body obtained with those for the reference sample and for $Zn_{0.97}Al_{0.02}Ga_{0.01}O$. In case of $Zn_{0.97}Al_{0.02}In_{0.01}O$, although thermal conductivity significantly decreased, electric conductivity decreased simultaneously and the increase of Seebeck coefficient was not observed. Thus, the power factor, the figure of merit and the dimensionless figure of merit all became smaller than those of $Zn_{0.98}Al_{0.02}O$.

Those results indicate that the improvement of the thermoelectric performance by co-doping with Al is peculiarly admitted only in Ga, among the elements of the 13$^{th}$ family.

POSSIBLE INDUSTRIAL APPLICATION

The thermoelectric conversion material of the present invention has a large dimensionless figure of merit ZT, and particularly useful as n-type thermoelectric conversion material for such use as electric generation by waste heat, by geothermal energy, or by solar heat at high temperature around 600 to 1000 deg C. Easy and low cost manufacturing is also feasible by sintering method or deposition method and so on using mixture, compact and so on of the oxide powders as materials.

What is claimed is:

1. An n-type thermoelectric conversion material, comprising aluminum including zinc oxide, wherein the aluminum including zinc oxide is represented by a general formula: $Zn_{1-x-y}Al_xGa_yO$ (wherein $0.01 \leq x \leq 0.04$, $0.01 \leq y \leq 0.03$, $0.9 \leq x/y \leq 2.0$).

2. The n-type thermoelectric conversion material of claim 1, wherein the n-type thermoelectric conversion material has a dimensionless figure of merit (ZT) not smaller than 0.2 at 600 deg C.

3. A method for manufacturing the n-type thermoelectric conversion material of claim 1 or claim 2 comprising sintering of powder materials, wherein, Al and Ga are simultaneously doped to form solid solution in ZnO, and further a fine structure is formed, wherein fine particles originated from Ga are dispersed in the fine structure.

* * * * *